US007354861B1

(12) United States Patent
Nakamura et al.

(10) Patent No.: US 7,354,861 B1
(45) Date of Patent: Apr. 8, 2008

(54) POLISHING METHOD AND POLISHING LIQUID

(75) Inventors: Kenro Nakamura, Kamakura (JP); Takeo Kubota, Kawasaki (JP); Gaku Minamihaba, Kawasaki (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 1502 days.

(21) Appl. No.: 09/453,831

(22) Filed: Dec. 2, 1999

(30) Foreign Application Priority Data

Dec. 3, 1998 (JP) ................. 10-344185

(51) Int. Cl.
*H01L 21/302* (2006.01)

(52) U.S. Cl. ..................... 438/692; 252/79.1
(58) Field of Classification Search ............... 252/79.1; 438/689, 745, 692
See application file for complete search history.

(56) References Cited

U.S. PATENT DOCUMENTS

| 4,574,292 | A | * | 3/1986 | Takikawa et al. ....... 346/76 PH |
| 4,959,113 | A | * | 9/1990 | Roberts ................ 216/86 |
| 5,389,352 | A | * | 2/1995 | Wang .................. 423/263 |
| 5,407,526 | A | * | 4/1995 | Danielson et al. ......... 156/636 |
| 5,750,440 | A | * | 5/1998 | Vanell et al. ............ 438/692 |
| 6,143,192 | A | * | 11/2000 | Westmoreland ........... 216/101 |

FOREIGN PATENT DOCUMENTS

| DK | 411413 A2 | * | 7/1990 |
| JP | 4-156511 | | 5/1992 |
| JP | 6-244176 | | 9/1994 |
| JP | 9-17972 | | 1/1997 |
| JP | 10-270651 | | 10/1998 |
| JP | 10-289984 | | 10/1998 |
| JP | 10-303397 | | 11/1998 |
| JP | 10-340871 | | 12/1998 |
| JP | 2000-053946 | | 2/2000 |

OTHER PUBLICATIONS

Lewis, Richard J., Sr, Hawley's condensed chemical dictionary, 1997, John Wiley and Sons, Inc., USA, 13th ed., p. 232.*

* cited by examiner

*Primary Examiner*—Shamim Ahmed
*Assistant Examiner*—Lynette T. Umez-Eronini
(74) *Attorney, Agent, or Firm*—Finnegan, Henderson, Farabow, Garrett & Dunner, L.L.P.

(57) ABSTRACT

Disclosed is a method for polishing a surface of a substrate containing Ru or a Ru compound in a surface region, said method comprising a polishing step with a polishing liquid containing tetravalent cerium ions. The polishing liquid is prepared by adding a compound having a tetravalent cerium ion or its solution to a solvent in or immediately before the polishing step of the substrate.

8 Claims, 3 Drawing Sheets

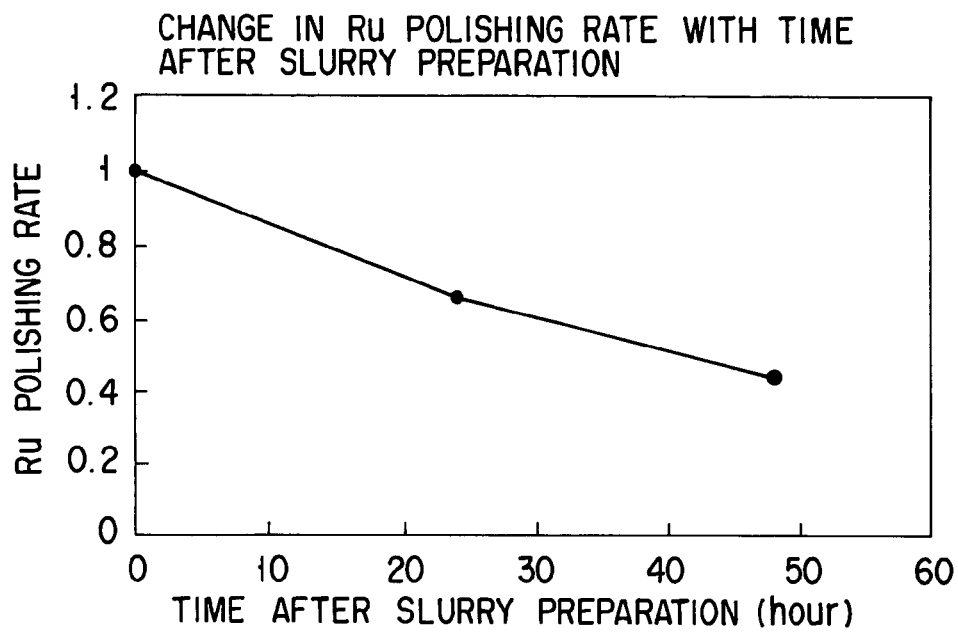
F I G. 1
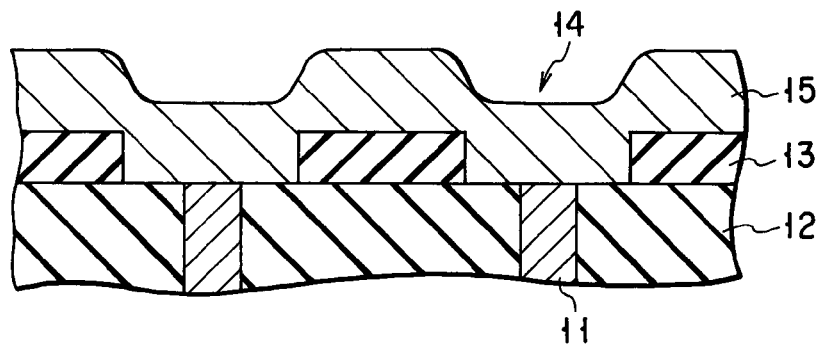
F I G. 2A
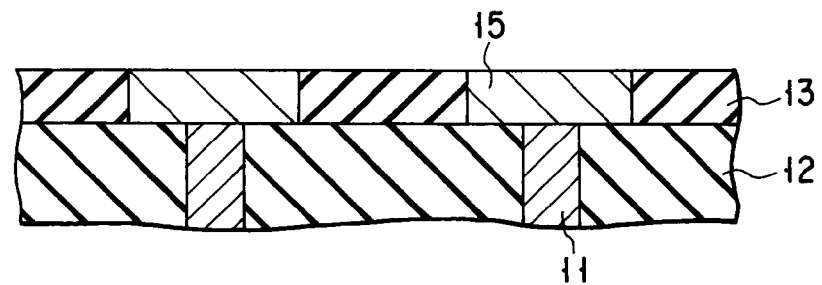
F I G. 2B
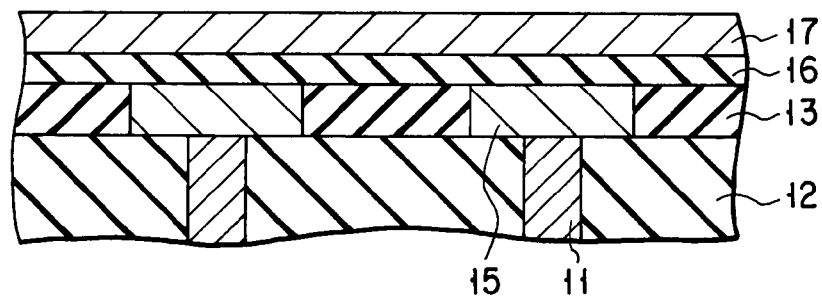
F I G. 2C

POLISHING METHOD AND POLISHING LIQUID

BACKGROUND OF THE INVENTION

The present invention relates to a polishing method adapted for the manufacture of a semiconductor device, etc., and a polishing liquid used in the polishing method.

In recent years, researches and developments of various fine processing technologies are being conducted in the field of manufacturing a semiconductor device in accordance with progress in the density and fineness of the semiconductor device. Particularly, a CMP (Chemical Mechanical Polishing) technology is absolutely necessary for flattening the interlayer insulating film, for forming a plug, for forming a buried metal wiring, and for forming a buried element isolation.

Use of the CMP technology is also being tried in the processing of an electrode for a capacitor. Particularly, it is considered very important to establish a method utilizing the CPM technology in the manufacture of DRAM or FRAM of the next era using a perovskite crystal for forming a dielectric film. It should be noted in this connection that it is necessary to select a noble metal or a perovskite type conductive oxide for forming the lower electrode of a capacitor in view of the compatibility of the lower electrode with the dielectric film. However, the noble metal and the perovskite type conductive oxide is chemically stable in general, making it difficult to employ a wet etching or a dry etching for processing the lower electrode of the capacitor. Such being the situation, it is considered very important to establish a method using the CPM technology.

On the other hand, the possibility of processing is increased in the CMP technology because a chemical function and a mechanical function are utilized in good balance in the polishing by the CMP technology.

However, the conventional polishing liquid used in the CMP technology was defective in that the polishing rate was low, leading to a low manufacturing efficiency of the semiconductor device. Also, the conventional polishing liquid was low in the selectivity ratio of the polishing rate relative to the underlying stopper film, making it difficult to obtain an uniform and stable processed configuration over the entire surface region of a single wafer or among different wafers.

BRIEF SUMMARY OF THE INVENTION

An object of the present invention is to provide a polishing method that permits a high polishing rate and a high selectivity ratio of the polishing rate relative to the underlying layer in the case where a noble metal or a perovskite type conductive oxide is polished by a CMP technology.

Another object of the present invention is to provide a polishing liquid used in the polishing method of the present invention.

According to a first aspect of the present invention, there is provided a polishing method, comprising the step of polishing a surface of a substrate containing Ru or a Ru compound in a surface region with a polishing liquid containing tetravalent cerium ions.

According to a second aspect of the present invention, there is provided a polishing method, comprising the step of polishing a surface of a substrate containing Ru or a Ru compound in a surface region with a polishing liquid containing tetravalent cerium ions, wherein the polishing liquid is prepared by adding a compound having a tetravalent cerium ion to a solvent in or immediately before the polishing step of the substrate.

Further, according to a third aspect of the present invention, there is provided a polishing liquid for polishing a surface of a substrate containing Ru or a Ru compound in a surface region, wherein the polishing liquid contains tetravalent cerium ions and nitrate ions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the change with time in the Ru polishing rate in the polishing with a polishing liquid;

FIGS. 2A to 2C are cross sectional views collectively showing a method of manufacturing a capacitor according to each of first and fourth embodiments of the present invention;

DETAILED DESCRIPTION OF THE INVENTION

Figure 3A:
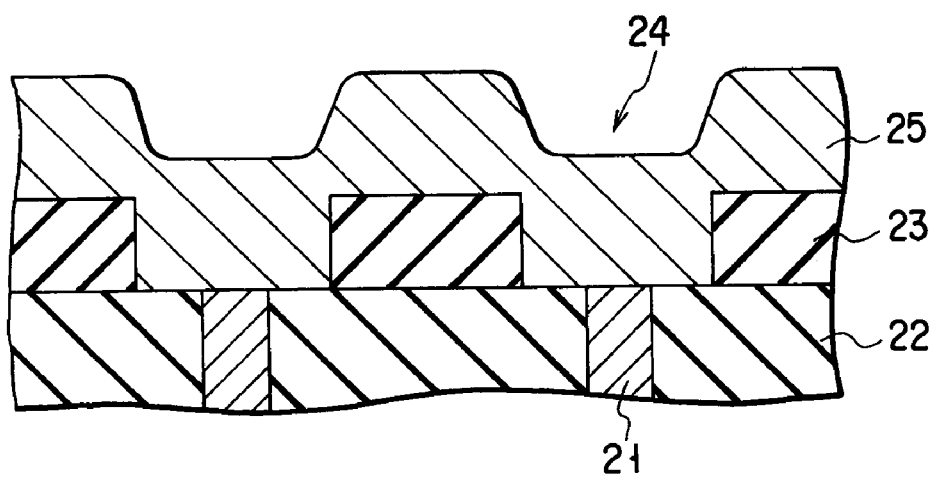
FIGS. 3A to 3C are cross sectional views collectively showing a method of manufacturing a capacitor according to each of second and fifth embodiments of the present invention.

The present invention provides a polishing method comprising the step of polishing a surface of a substrate containing Ru or a Ru compound in a surface region with a polishing liquid containing tetravalent cerium ions.

There are divalent, trivalent and tetravalent cerium ions. Among these cerium ions, the tetravalent cerium ion alone produces a high oxidizing power and exhibits excellent polishing properties relative to Ru or a Ru compound.

It is desirable for the polishing liquid containing tetravalent cerium ions to further contain nitrate ions. For example, the polishing liquid should desirably contain cerium (IV) nitrate or diammonium cerium (IV) nitrate. To be more specific, the polishing liquid used in the present invention is prepared by dissolving cerium (IV) nitrate in a solvent, or by dissolving diammonium cerium (IV) nitrate in a solvent. Of course, an aqueous solution of cerium (IV) nitrate and an aqueous solution of diammonium cerium (IV) nitrate can be used as effective polishing liquids in the present invention.

In the case of polishing Ru using a solution of cerium (IV) nitrate as a polishing liquid, the concentration of cerium (IV) nitrate in the solution should desirably be 0.75% by weight or more, preferably 0.75 to 2% by weight, and most preferably 1 to 1.75% by weight.

In the case of polishing Ru using a solution of diammonium cerium (IV) nitrate as a polishing liquid, the concentration of diammonium cerium (IV) nitrate in the solution should desirably be 3% by weight or more, preferably 3 to 8% by weight, and most preferably 4 to 7% by weight.

The other cerium (IV) compounds that can be used in the present invention for preparing the polishing liquid also include, for example, cerium sulfate, $Ce(NO_3)_3OH$, $M_2Ce(NO_3)_6$, and $M_4Ce(SO_4)_4$ (M: monovalent metal ion).

The polishing liquid of the present invention produces a markedly high oxidizing power and a polishing capability, which are unimaginable in the past, when applied to the polishing of a Ru layer or a Ru compound layer. Therefore, the polishing liquid produces its effect sufficiently even if abrasive grains are not contained in the polishing liquid. Where abrasive grains are contained in the polishing liquid, the abrasive grains include the grains of alumina, silica, ceria, and the like. The abrasive grains should desirably be contained in the polishing liquid in an amount of 0.1 to 2% by weight.

In general, a cerium (IV) compound is stable where the compound is contained in a solution in a high concentration. If the solution is diluted to lower the concentration of the cerium (IV) compound, however, the oxidizing power and polishing capability of the compound are lowered with time. It follows that, in the case of using a polishing liquid containing a cerium (IV) compound for the polishing treatment, the polishing liquid must be used for the polishing soon after the dilution. Preferably, the polishing liquid should be used for the polishing immediately after or simultaneously with the dilution.

FIG. 1 is a graph showing the change with time in the Ru polishing rate in the polishing with a polishing liquid containing 5% by weight of diammonium cerium (IV) nitrate, which was prepared by diluting with water an aqueous solution containing 20% by weight of diammonium cerium (IV) nitrate. As apparent from FIG. 1, the polishing rate of Ru is lowered with time.

It should be noted that an allowable fluctuation in the polishing rate is about 10%. FIG. 1 indicates that, if it is allowable for the polishing rate to be lowered from 1 to 0.9, it is necessary to use the polishing liquid for the polishing treatment within 8 hours from the preparation.

As described above, it is most desirable to use the polishing liquid containing a cerium (IV) compound for the polishing treatment simultaneously with the dilution. For example, it is most desirable to supply a compound having a tetravalent cerium ion to the substrate surface together with a solvent in polishing the substrate surface.

A typical example of the Ru compound that is to be polished in the present invention is $SrRuO_3$.

As described above, a polishing liquid containing tetravalent cerium ions is used in the present invention for polishing a Ru layer or a Ru compound layer so as to markedly improve the polishing rate. The particular technique of the present invention also permits markedly improving a ratio (selectivity ratio) of the polishing rate of a Ru layer or a Ru compound layer to the polishing rate of a $SiO_2$ layer.

Various embodiments of the present invention will now be described with reference to the accompanying drawings.

EMBODIMENT 1

How to manufacture a capacitor by the CMP technology will now be described as a first embodiment of the present invention with reference to FIGS. 2A to 2C.

As shown in the drawings, a plug 11 for electrical connection is buried in an insulating film 12 formed on a main surface of a silicon substrate (not shown). Then, a $SiO_2$ film 13 is formed in a thickness of about 100 nm by a plasma CVD method using TEOS on the entire surface, followed by forming an aperture 14 (opening) having a diameter of about 300 nm in the $SiO_2$ film 13 right above the plug 11. After formation of the aperture 14, a Ru film 15 forming a lower electrode of a capacitor is formed on the entire surface by a sputtering method or a CVD method such that the aperture 14 is filled with the Ru film 15, as shown in FIG. 2A.

In the next step, the Ru film 15 is polished by a CMP method with the $SiO_2$ film 13 used as a stopper, with the result that the lower electrode consisting of the Ru film 15 is insulated for each cell, as shown in FIG. 2B. Used in the CMP method is a polishing liquid prepared by adding diammonium cerium nitrate to a dispersion prepared by dispersing alumina particles having a particle diameter of 30 nm in water. It is desirable for the polishing liquid to contain 1% by weight of alumina particles and 5% by weight (or 4 to 7% by weight) of diammonium cerium nitrate. Used in the CMP method is IC1000/Suba400 (trade name of a polishing pad manufactured by Rhodel Nitta K.K.). The polishing is performed under a load of 100 gf/cm$^2$, and the top ring and the turntable are rotated at a speed of 100 rpm.

In the next step, a $BaSrTiO_3$ film 16 acting as a dielectric film of a capacitor is formed in a thickness of about 40 nm by a sputtering method or a CVD method. Where the $BaSrTiO_3$ film 16 as formed is amorphous, the film is annealed to form crystals of perovskite structure. Then, a Ru film 17 acting as an upper electrode of the capacitor is formed by a sputtering method or a CVD method in a thickness of about 60 nm, as shown in FIG. 2C.

After formation of the Ru film 17, an interlayer insulating film (not shown) is formed on the Ru film 17, followed by selectively removing the interlayer insulating film to form an opening. Further, a plug (not shown) for electric connection to the Ru film 17 is formed in the opening so as to finish preparation of the capacitor for DRAM of the next era.

EMBODIMENT 2

How to manufacture a capacitor by the CMP technology will now be described as a second embodiment of the present invention with reference to FIGS. 3A to 3C.

As shown in the drawings, a plug 21 for electrical connection is buried in an insulating film 22 formed on a main surface of a silicon substrate (not shown). Then, a $SiO_2$ film 23 is formed in a thickness of about 150 nm by a plasma CVD method using TEOS on the entire surface, followed by forming an aperture 24 (opening) having a diameter of about 300 nm in the $SiO_2$ film 23 right above the plug 21. After formation of the aperture 24, a Ru film 25 forming a lower electrode of a capacitor is formed on the entire surface by a sputtering method or a CVD method such that the aperture 24 is filled with the Ru film 25, as shown in FIG. 3A.

Figure 3B:
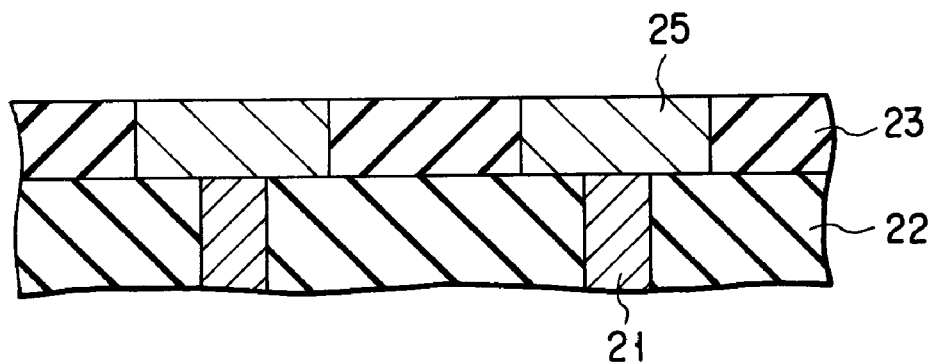
Figure 3C:
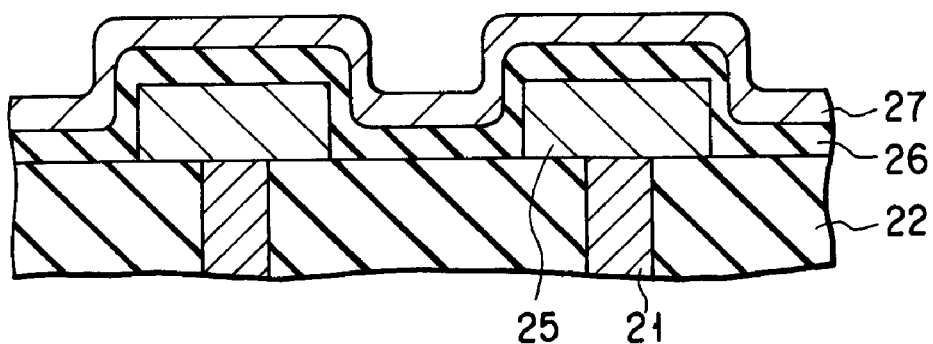

In the next step, the Ru film 25 is polished by a CMP method with the $SiO_2$ film 23 used as a stopper, with the result that the lower electrode consisting of the Ru film 25 is insulated for each cell, as shown in FIG. 3B. Used in the CMP method is a polishing liquid prepared by adding diammonium cerium nitrate to a dispersion prepared by dispersing alumina particles having a particle diameter of 30 nm in water. It is desirable for the polishing liquid to contain 1% by weight of alumina particles and 5% by weight (or 4 to 7% by weight) of diammonium cerium nitrate. Used in the CMP method is IC1000/Suba400 referred to previously. The polishing is performed under a load of 100 gf/cm$^2$, and the top ring and the turntable are rotated at a speed of 100 rpm.

Then, the SiO$_2$ film 23 is removed by a wet etching using hydrofluoric acid or ammonium fluoride or by a reactive ion etching using a fluorocarbon-based gas, followed by forming a BaSrTiO$_3$ film 26 acting as a dielectric film of a capacitor by a sputtering method or a CVD method. Where the BaSrTiO$_3$ film 26 as formed is amorphous, the film is annealed to form crystals of perovskite structure. Then, a Ru film 27 acting as an upper electrode of the capacitor is formed by a sputtering method or a CVD method in a thickness of about 60 nm, as shown in FIG. 3C.

After formation of the Ru film 27, an interlayer insulating film (not shown) is formed on the Ru film 27, followed by selectively removing the interlayer insulating film to form an opening. Further, a plug (not shown) for electric connection to the Ru film 27 is formed in the opening so as to finish preparation of the capacitor for DRAM of the next era.

EMBODIMENT 3

Figure 4A:
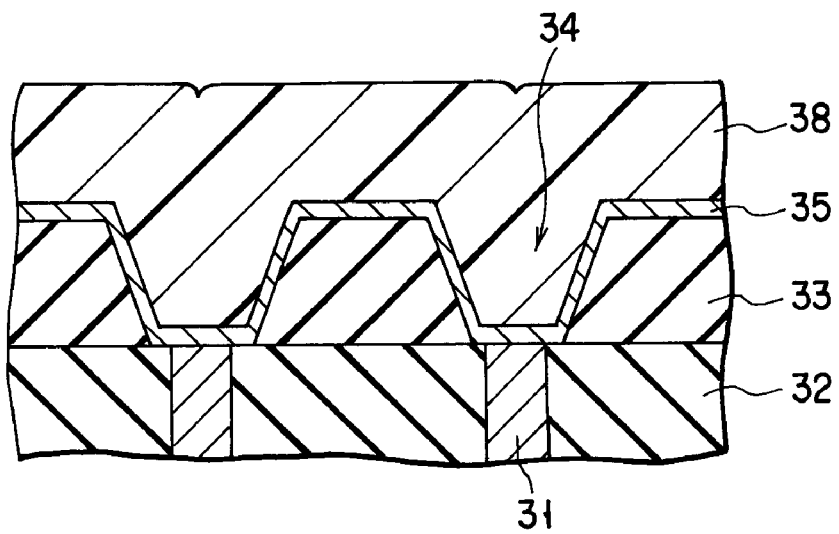
FIGS. 4A to 4C are cross sectional views collectively showing a method of manufacturing a capacitor according to each of third and sixth embodiments of the present invention.

How to manufacture a capacitor by the CMP technology will now be described as a third embodiment of the present invention with reference to FIGS. 4A to 4C.

As shown in the drawings, a plug 31 for electrical connection is buried in an insulating film 32 formed on a main surface of a silicon substrate (not shown). Then, a SiO$_2$ film 33 is formed in a thickness of about 300 nm by a plasma CVD method using TEOS on the entire surface, followed by forming an aperture 34 (opening) having a diameter of about 200 nm in the SiO$_2$ film 33 right above the plug 31. It is desirable for the side wall defining the aperture 34 to be inclined or tapered by about 10° relative to a vertical plane. After formation of the aperture 34, a Ru film 35 forming a lower electrode of a capacitor is formed on the entire surface by a sputtering method or a CVD method in a thickness of about 60 nm. Further, a capping film 38 such as resist or SOG (Spin On Glass) is formed by, for example, a spin coating method on the entire surface to fill the aperture 34, as shown in FIG. 4A.

Figure 4B:
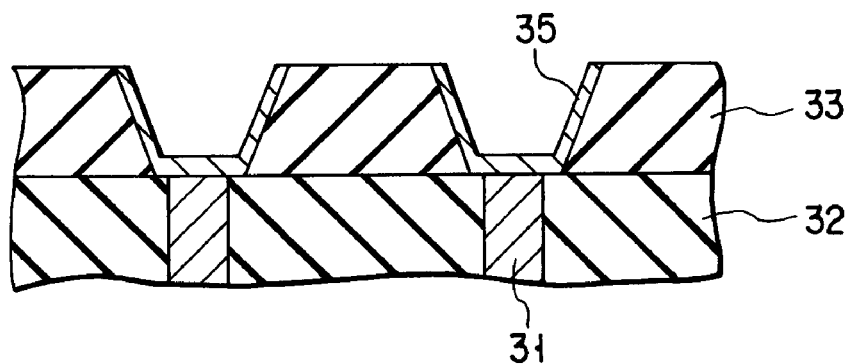
Figure 4C:
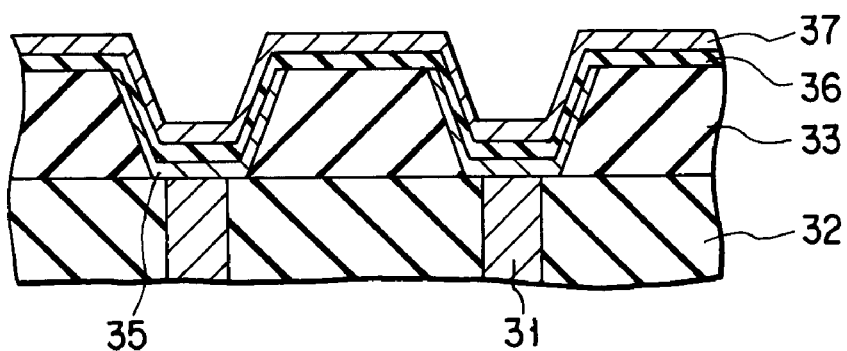

In the next step, the Ru film 35 and the capping film 38 are polished by a CMP method with the SiO$_2$ film 33 used as a stopper, with the result that the lower electrode consisting of the Ru film 35 is insulated for each cell, as shown in FIG. 4B. Used in the CMP method is a polishing liquid prepared by adding diammonium cerium nitrate to a dispersion prepared by dispersing alumina particles having a particle diameter of 30 nm in water. It is desirable for the polishing liquid to contain 1% by weight of alumina particles and 5% by weight (or 4 to 7% by weight) of diammonium cerium nitrate. Used in the CMP method is IC1000/Suba400 referred to previously. The polishing is performed under a load of 100 gf/cm$^2$, and the top ring and the turntable are rotated at a speed of 100 rpm.

In the next step, the capping film 38 remaining within the aperture 34 is removed, as shown in FIG. 4B. Where the capping film 38 is made of resist, the capping film 38 is dipped in a peeling solution, or an ashing is applied to the capping film 38 for removing the capping film 38. Where the capping film 38 is made of SOG, it is effective to expose the capping film 38 to an HF vapor for removing the capping film 38. Incidentally, the capping film 38 functions as a sacrificing film for preventing the dust generated in the CMP step from being attached to the Ru film 35 within the aperture 34.

Further, a BaSrTiO$_3$ film 36 acting as a dielectric film of a capacitor is formed in a thickness of about 40 nm by a sputtering method or a CVD method. Where the BaSrTiO$_3$ film 36 as formed is amorphous, the film is annealed to form crystals of perovskite structure. Then, a Ru film 37 acting as an upper electrode of the capacitor is formed by a sputtering method or a CVD method in a thickness of about 60 nm, as shown in FIG. 4C.

After formation of the Ru film 37, an interlayer insulating film (not shown) is formed on the Ru film 37, a followed by selectively removing the interlayer insulating film to form an opening. Further, a plug (not shown) for electric connection to the Ru film 37 is formed in the opening so as to finish preparation of the capacitor for DRAM of the next era.

Where the conventional polishing liquid was used for performing the CMP method, a ratio of the polishing rate of the Ru film to the polishing rate of the SiO$_2$ film, i.e., the selectivity ratio, was only about 2. Since the selectivity ratio was low, the SiO$_2$ film (13, 23, 33) failed to perform sufficiently the function of the stopper, making it difficult to control the thickness of the Ru film (15, 25, 35) after the polishing. As a result, nonuniformity in the shape of the lower electrode was brought about in a single wafer or among different wafers, leading to a low reliability of the manufactured semiconductor device.

On the other hand, the polishing liquid defined in the present invention permits increasing the selectivity ratio of the Ru film to the SiO$_2$ film to such a large value as 100, with the result that it is possible to obtain a stable processed shape. It should also be noted that the polishing rate of the Ru film achieved by the conventional polishing liquid was only about 200 Å/min. On the other hand, the polishing liquid of the present invention permits increasing the polishing rate to 2000 Å/min. Naturally, the CMP processing time for a single wafer can be shortened in the present invention so as to improve the manufacturing efficiency.

It should also be noted that, in the capacitor prepared by the CMP method of the present invention (particularly, embodiments 1 and 2), the surface of the lower electrode in contact with the dielectric film is polished microscopically smooth by the CMP method so as to moderate the current concentration and to suppress the leak current. Further, the crystallinity and degree of orientation of the dielectric film are improved so as to increase the dielectric constant. As a result, the electric characteristics and the reliability of the capacitor are improved.

Table 1 shows the effectiveness of the polishing liquid of the present invention. Specifically, given in Table 1 are experimental data showing how the polishing rate of the Ru film was changed depending on the oxidizing agent added to the polishing liquid. The polishing liquid used in this experiment contained 1% by weight of alumina particles as abrasive grains.

TABLE 1

Dependence of Ru polishing rate on oxidizing agent

| Oxidizing agent | Ru polishing rate (Å/min) | Selectivity ratio to SiO$_2$ |
|---|---|---|
| Diammonium cerium nitrate (5 wt %) | 2000 | 100 |
| Hydrogen peroxide (3.5 wt %) + nitric acid* | 200 | 10 |
| Ammonium persulfate (10 wt %) | 50 | 2.5 |
| None | 5 | 0.25 |

*Added to set pH at 2;

Table 1 shows that the polishing rate of the Ru film was drastically increased to 2000 Å/min in the case of using diammonium cerium nitrate as the oxidizing agent. It is also shown that the selectivity ratio to $SiO_2$ is also increased by the increase in the polishing rate of the Ru film. When it comes to a standard redox potential used as a criterion of the oxidizing power, diammonium cerium nitrate is inferior to ammonium persulfate. Specifically, the standard redox potential when the tetravalent cerium ion of diammonium cerium nitrate is converted into the trivalent cerium ion is 1.72 V. On the other hand, the standard redox potential when the persulfate ion of ammonium persulfate is converted into the sulfate ion is 2.01 V. Nevertheless, diammonium cerium nitrate permits a greater polishing rate, which suggests that diammonium cerium nitrate causes Ru to perform a special reaction.

In embodiments 1 to 3 described above, alumina particles are contained as abrasive grains in the polishing liquid. Alternatively, silica or ceria particles can be used as the abrasive grains in place of the alumina grains. It is also possible to use an aqueous solution itself of diammonium cerium nitrate, which does not contain abrasive grains, as the polishing liquid. Further, the load, the rotation speeds of the top ring and the turntable, etc. can be changed appropriately in the polishing step.

EMBODIMENT 4

How to manufacture a capacitor by the CMP technology will now be described as a fourth embodiment of the present invention with reference to FIGS. 2A to 2C.

In embodiments 1 to 3 described previously, Ru was used for forming the lower electrode and the upper electrode of the capacitor. Incidentally, embodiments 4 to 6 that are to be described are substantially equal to embodiments 1 to 3, respectively, except that, in embodiments 4 to 6, $SrRuO_3$ is used in place of Ru for forming the lower electrode and the upper electrode of the capacitor. Such being the situation, embodiments 4 to 6 will also be described with reference to FIGS. 2A to 4C, respectively.

As shown in FIGS. 2A to 2C, a plug 11 for electrical connection is buried in an insulating film 12 formed on a main surface of a silicon substrate (not shown). Then, a $SiO_2$ film 13 is formed in a thickness of about 100 nm by a plasma CVD method using TEOS on the entire surface, followed by forming an aperture 14 (opening) having a diameter of about 300 nm in the $SiO_2$ film 13 right above the plug 11. After formation of the aperture 14, a $SrRuO_3$ film 15 forming a lower electrode of a capacitor is formed on the entire surface by a sputtering method or a CVD method such that the aperture 14 is filled with the $SrRuO_3$ film 15, as shown in FIG. 2A.

In the next step, the $SrRuO_3$ film 15 is polished by a CMP method with the $SiO_2$ film 13 used as a stopper, with the result that the lower electrode consisting of the $SrRuO_3$ film 15 is insulated for each cell, as shown in FIG. 2B. An aqueous solution containing 1% by weight (or 1 to 2% by weight) of diammonium cerium nitrate is used as the polishing liquid. Used in the CMP method is IC1000/Suba400 referred to previously. The polishing is performed under a load of 100 gf/cm$^2$, and the top ring and the turntable are rotated at a speed of 100 rpm.

In the next step, a $BaSrTiO_3$ film 16 acting as a dielectric film of a capacitor is formed in a thickness of about 40 nm by a sputtering method or a CVD method.

Where the $BaSrTiO_3$ film 16 as formed is amorphous, the film is annealed to form crystals of perovskite structure.

Then, a $SrRuO_3$ film 17 acting as an upper electrode of the capacitor is formed by a sputtering method or a CVD method in a thickness of about 60 nm, as shown in FIG. 2C.

After formation of the $SrRuO_3$ film 17, an interlayer insulating film (not shown) is formed on the $SrRuO_3$ film 17, followed by selectively removing the interlayer insulating film to form an opening. Further, a plug (not shown) for electric connection to the $SrRuO_3$ film 17 is formed in the opening so as to finish preparation of the capacitor for DRAM of the next era.

EMBODIMENT 5

How to manufacture a capacitor by the CMP technology will now be described as a fifth embodiment of the present invention with reference to FIGS. 3A to 3C.

As shown in the drawings, a plug 21 for electrical connection is buried in an insulating film 22 formed on a main surface of a silicon substrate (not shown). Then, a $SiO_2$ film 23 is formed in a thickness of about 150 nm by a plasma CVD method using TEOS on the entire surface, followed by forming an aperture 24 (opening) having a diameter of about 300 nm in the $SiO_2$ film 23 right above the plug 21. After formation of the aperture 24, a $SrRuO_3$ film 25 forming a lower electrode of a capacitor is formed on the entire surface by a sputtering method or a CVD method such that the aperture 24 is filled with the $SrRuO_3$ film 25, as shown in FIG. 3A.

In the next step, the $SrRuO_3$ film 25 is polished by a CMP method with the $SiO_2$ film 23 used as a stopper, with the result that the lower electrode consisting of the $SrRuO_3$ film 25 is insulated for each cell, as shown in FIG. 3B. An aqueous solution containing 1% by weight (or 1 to 2% by weight) of diammonium cerium nitrate, which does not contain abrasive grains, is used as the polishing liquid in the CMP method. Used in the CMP method is IC1000/Suba400 referred to previously. The polishing is performed under a load of 100 gf/cm$^2$, and the top ring and the turntable are rotated at a speed of 100 rpm.

Then, the $SiO_2$ film 23 is removed by a wet etching using hydrofluoric acid or ammonium fluoride or by a reactive ion etching using a fluorocarbon-based gas, followed by forming a $BaSrTiO_3$ film 26 acting as a dielectric film of a capacitor by a sputtering method or a CVD method. Where the $BaSrTiO_3$ film 26 as formed is amorphous, the film is annealed to form crystals of perovskite structure. Then, a $SrRuO_3$ film 27 acting as an upper electrode of the capacitor is formed by a sputtering method or a CVD method in a thickness of about 60 nm, as shown in FIG. 3C.

After formation of the $SrRuO_3$ film 27, an interlayer insulating film (not shown) is formed on the $SrRuO_3$ film 27, followed by selectively removing the interlayer insulating film to form an opening. Further, a plug (not shown) for electric connection to the $SrRuO_3$ film 27 is formed in the opening so as to finish preparation of the capacitor for DRAM of the next era.

EMBODIMENT 6

How to manufacture a capacitor by the CMP technology will now be described as a sixth embodiment of the present invention with reference to FIGS. 4A to 4C.

As shown in the drawings, a plug 31 for electrical connection is buried in an insulating film 32 formed on a main surface of a silicon substrate (not shown). Then, a $SiO_2$ film 33 is formed in a thickness of about 300 nm by a plasma CVD method using TEOS on the entire surface, followed by forming an aperture 34 (opening) having a diameter of about 200 nm in the $SiO_2$ film 33 right above the plug 31. It is desirable for the side wall defining the aperture 34 to be inclined or tapered by about 100 relative to a vertical plane. After formation of the aperture 34, a $SrRuO_3$ film 35 forming a lower electrode of a capacitor is formed on the entire surface by a sputtering method or a CVD method in a thickness of about 60 nm. Further, a capping film 38 such as resist or SOG (Spin On Glass) is formed by, for example, a spin coating method on the entire surface to fill the aperture 34, as shown in FIG. 4A.

In the next step, the $SrRuO_3$ film 35 and the capping film 38 are polished by a CMP method with the $SiO_2$ film 33 used as a stopper, with the result that the lower electrode consisting of the $SrRuO_3$ film 35 is insulated for each cell, as shown in FIG. 4B. An aqueous solution containing 1% by weight (or 1 to 2% by weight) of diammonium cerium nitrate, which does not contain abrasive grains, is used as the polishing liquid in the CMP method. Used in the CMP method is IC1000/Suba400 referred to previously. The polishing is performed under a load of 100 $gf/cm^2$, and the top ring and the turntable are rotated at a speed of 100 rpm.

In the next step, the capping film 38 remaining within the aperture 34 is removed, as shown in FIG. 4B. Where the capping film 38 is made of resist, the capping film 38 is dipped in a peeling solution, or an ashing is applied to the capping film 38 for removing the capping film 38. Where the capping film 38 is made of SOG, it is effective to expose the capping film 38 to an HF vapor for removing the capping film 38. Incidentally, the capping film 38 functions as a sacrificing film for preventing the dust generated in the CMP step from being attached to the $SrRuO_3$ film 35 within the aperture 34.

Further, a $BaSrTiO_3$ film 36 acting as a dielectric film of a capacitor is formed in a thickness of about 40 nm by a sputtering method or a CVD method. Where the $BaSrTiO_3$ film 36 as formed is amorphous, the film is annealed to form crystals of perovskite structure. Then, a $SrRuO_3$ film 37 acting as an upper electrode of the capacitor is formed by a sputtering method or a CVD method in a thickness of about 60 nm, as shown in FIG. 4C.

After formation of the $SrRuO_3$ film 37, an interlayer insulating film (not shown) is formed on the $SrRuO_3$ film 37, followed by selectively removing the interlayer insulating film to form an opening. Further, a plug (not shown) for electric connection to the $SrRuO_3$ film 37 is formed in the opening so as to finish preparation of the capacitor for DRAM of the next era.

Where the conventional polishing liquid was used for performing the CMP method, it was difficult to achieve a ratio, which was greater than 1, of the polishing rate of the Ru film to the polishing rate of the $SiO_2$ film, i.e., the selectivity ratio. Since the selectivity ratio was low, the $SiO_2$ film (13, 23, 33) failed to perform sufficiently the function of the stopper, making it difficult to control the thickness of the $SrRuO_3$ film (15, 25, 35) after the polishing. As a result, nonuniformity in the shape of the lower electrode was brought about in a single wafer or among different wafers, leading to a low reliability of the manufactured semiconductor device.

On the other hand, the polishing liquid defined in the present invention permits increasing the selectivity ratio of the $SrRuO_3$ film to the $SiO_2$ film to such a large value as 150, with the result that it is possible to obtain a stable processed shape. It should also be noted that the polishing rate of the $SrRuO_3$ film achieved by the polishing liquid of the present invention was as high as 3000 Å/min. Naturally, the CMP processing time for a single wafer can be shortened in the present invention so as to improve the manufacturing efficiency.

It should also be noted that, in the capacitor prepared by the CMP method of the present invention (particularly, embodiments 4 and 5), the surface of the lower electrode in contact with the dielectric film is polished microscopically smooth by the CMP method so as to moderate the current concentration and to suppress the leak current. Further, the crystallinity and degree of orientation of the dielectric film are improved so as to increase the dielectric constant. As a result, the electric characteristics and the reliability of the capacitor are improved.

Table 2 shows the effectiveness of the polishing liquid of the present invention. Specifically, given Table 2 are experimental data showing how the polishing rate of the $SrRuO_3$ film was changed depending on the oxidizing agent added to the polishing liquid. Abrasive grains were not contained in the polishing liquid used in this experiment.

TABLE 2

Dependence of $SrRuO_3$ film

| Oxidizing agent | $SrRuO_3$ polishing rate (Å/min) |
|---|---|
| Diammonium cerium nitrate (1 wt %) | 3000 |
| Ammonium persulfate (10 wt %) | 280 |
| Hydrogen peroxide (3.5 wt %) | 0 |

Table 2 shows that the polishing rate of the $SrRuO_3$ film was drastically increased to 3000 Å/min in the case of using diammonium cerium nitrate as the oxidizing agent. When it comes to a standard redox potential used as a criterion of the oxidizing power, diammonium cerium nitrate was found to be inferior to ammonium persulfate, as already pointed out. Nevertheless, diammonium cerium nitrate permits a greater polishing rate, which suggests that diammonium cerium nitrate causes $SrRuO_3$ to perform a special reaction.

In embodiments 4 to 6 described above, an aqueous solution of diammonium cerium nitrate was used as the polishing liquid. Of course, it is possible for the polishing liquid to contain abrasive grains such as alumina, silica or ceria particles. Further, the load, the rotation speeds of the top ring and the turntable, etc. can be changed appropriately in the polishing step.

In embodiments 1 to 6 described above, Ru or $SrRuO_3$ was used for forming the upper electrode of a capacitor. However, other materials such as $RuO_2$, W and WN can also be used for forming the upper electrode. Also, perovskite crystals such as $SrTiO_3$, $BaTiO_3$, $PbTiO_3$ and $PbZrTiO_3$ can also be used for forming the dielectric film in addition to $BaSrTiO_3$ used in the embodiments described above. Where perovskite crystals exhibiting a ferroelectricity such as $BaSrTiO_3$, $BaTiO_3$, $PbTiO_3$ and $PbZrTiO_3$ are used for forming the dielectric film, the dielectric film can also be applied to an FRAM.

The present invention is not limited to the embodiments described above. In other words, the present invention can be worked in variously modified fashions within the technical scope of the present invention.

In the present invention, a polishing liquid containing diammonium cerium nitrate is used in the CMP method so as to markedly increase the polishing rate of a Ru film or a Ru compound film. It is also possible to markedly increase a ratio of the polishing rate of the Ru or Ru compound film to the polishing rate of a $SiO_2$ film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
preparing a first polishing liquid containing tetravalent cerium ions in a first concentration;
adding a solvent for dilution to said first polishing liquid to form a second polishing liquid containing tetravalent cerium ions in a second concentration lower than the first concentration; and
polishing a surface of a substrate containing Ru or a Ru compound in a surface region with the second polishing liquid,
wherein said Ru compound is $SrRuO_3$, and
further wherein said addition of the solvent is carried out upon or immediately before the polishing of said substrate.

2. A polishing method according to claim 1, wherein said second polishing liquid does not contain abrasive grains.

3. A polishing method according to claim 1, wherein said second polishing liquid contains cerium (IV) nitrate in a concentration of 0.75% or more by weight.

4. A polishing method according to claim 3, wherein said second polishing liquid contains cerium (IV) nitrate in a concentration of 0.75 to 2% by weight.

5. A polishing method according to claim 1, wherein said second polishing liquid contains diammonium cerium (IV) nitrate in a concentration of 3% or more by weight.

6. A polishing method according to claim 5, wherein said second polishing liquid contains diammonium cerium (IV) nitrate in a concentration of 3 to 8% by weight.

7. A polishing method according to claim 1, wherein said solvent has a property of dissolving a solute of said first polishing liquid and does not substantially contain any solute.

8. A polishing method according to claim 1, wherein said solvent consists essentially of water.

* * * * *